(12) United States Patent
Kim et al.

(10) Patent No.: US 6,409,830 B1
(45) Date of Patent: Jun. 25, 2002

(54) PROCESS FOR PREPARING A LIMO$_2$ TYPE HETEROMETALLIC OXIDE FILM

(75) Inventors: Yun-Soo Kim; Won-Yong Koh; Su-Jin Ku, all of Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 0 days.

(21) Appl. No.: 09/585,019

(22) Filed: Jun. 1, 2000

Related U.S. Application Data

(63) Continuation of application No. PCT/KR98/00394, filed on Dec. 2, 1998, now abandoned.

(30) Foreign Application Priority Data

Dec. 2, 1998 (KR) .............................................. 97-65147

(51) Int. Cl.$^7$ ......................... C30B 25/00; C30B 29/16; C23C 16/18
(52) U.S. Cl. ....................... 117/104; 117/944; 117/950; 427/255.32; 427/255.34
(58) Field of Search ............................ 117/88, 104, 944, 117/950, 953; 427/255.32, 255.34, 901

(56) References Cited

U.S. PATENT DOCUMENTS 4,880,492 A * 11/1989 Erdmann et al. ......... 422/245.1
6,063,951 A *  5/2000 Kim et al. .................. 556/182

FOREIGN PATENT DOCUMENTS

JP            404294063       * 10/1992

* cited by examiner

*Primary Examiner*—Benjamin L. Utech
*Assistant Examiner*—Donald L. Champagne
(74) *Attorney, Agent, or Firm*—Rosenman & Colin, LLP

(57) ABSTRACT

An organometallic compound of formula LiOR'.(R'O)MR$_2$ is vaporized at a low temperature and employed in a CVD process of a heterometallic oxide film of the LiMO$_2$ type, wherein M is a Group 13 element such as Al or Ga; R is a C$_{1-10}$ alkyl group; and R' is a C$_{2-10}$ alkyl group.

4 Claims, No Drawings

PROCESS FOR PREPARING A LIMO₂ TYPE HETEROMETALLIC OXIDE FILM

CROSS REFERENCE TO RELATED APPLICATION

This application is a contiunation of International Application PCT/KR98/00394, with an international filing date of Dec. 2, 1998, now abandoned.

FIELD OF THE INVENTION

The present invention relates to a process for preparing a heterometallic oxide film of the $LiMO_2$ type, wherein M is a Group 13 element such as Al or Ga, using a volatile organometallic compound of formula $LiOR'.(R'O)MR_2$ wherein R is a $C_{1-10}$ alkyl group; and R' is a $C_{2-10}$ alkyl group.

DESCRIPTION OF THE PRIOR ART

Theoretical and experimental studies have projected that a heterometallic oxide of the $LiMO_2$ type, e.g., $LiAlO_2$ and $LiGaO_2$ would be useful in a process for depositing a blue luminescent GaN film thereon because its lattice constant (a-axis) is almost identical with that of GaN (Nicholls, J. F. H. et al., "Growth and optical properties of GaN grown by MBE on novel lattice-matched oxide substrates" in *Gallium Nitride and Related Materials;* and Ponce, F. A. et al., eds. Materials Research Society Symposium Proceedings, 395, pp. 535–539 (Materials Research Society, Pittsburgh, Pa., USA, 1990)).

From these studies, it is thought that films of $LiO_2$ type grown on Si wafers should be useful as buffer layer for the deposition of GaN films.

Despite such anticipated usefulness, a $LiMO_2$ film has not been successfully prepared in the past due mainly to the lack of suitable organometallic precursor compounds that can be used in the chemical vapor deposition (CVD) process for preparing a $LiMO_2$ type oxide.

Accordingly, there has existed a need to develop a scheme for the preparation of such precursor compounds.

SUMMARY OF THE INVENTION

Accordingly, it is an object of the present invention to provide a process for preparing a heterometallic oxide film of the $LiMO_2$ type, wherein M is a Group 13 element.

In accordance with one aspect of the present invention, there is provided a process for preparing said film which comprises contacting the vapor of a volatile organometallic compound of formula $LiOR'.(R'O)MR_2$ with a substrate heated to a temperature above 300° C., wherein M is a Group 13 element; R is a $C_{1-10}$ alkyl group; and R' is a $C_{2-10}$ alkyl group.

DETAILED DESCRIPTION OF THE INVENTION

The organometallic compound which may be used in the present invention is a highly volatile compound of formula $LiOR'.(R'O)MR_2$ which has a Li:M:O atomic ratio of 1:1:2. It can be, therefore, advantageously used in a CVD process for depositing a $LiMO_2$ type heterometallic oxide film on a substrate. In the organometallic compound of formula $LiOR'.(R'O)MR_2$, M is a Group 13 element such as Al or Ga; R is a $C_{1-10}$ alkyl group; and R' is a $C_{2-10}$ alkyl group. The preferred compounds in practicing the present invention are lithium dimethylaluminum isopropoxide, $LiOPr^i.(Pr^iO)$ 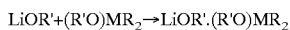$AlMe_2$; lithium dimethylaluminum tert-butoxide, $LiOBu^t.(Bu^tO)AlMe_2$; and lithium dimethylgallium isopropoxide, $LiOPr^i.(Pr^iO)GaMe_2$.

The organometallic compound may be prepared according to the process described in WO 97/29112 or in U.S. Pat. No. 6,063,951. That is, a dialkylmetal alkoxide($(R'O)MR_2$) may be directly reacted with a lithium alkoxide($Li(OR')$) in a molar ratio of 1:1 to obtain the desired product, as shown below:

$$LiOR'+(R'O)MR_2 \rightarrow LiOR'.(R'O)MR_2$$

wherein M, R and R' have the same meanings as defined above.

The organometallic compound thus obtained may be preferably vaporized at a temperature ranging from room temperature to 100° C.

A heterometallic oxide film of the $LiMO_2$ type may be deposited on a substrate by bringing the vapor of the organometallic compound thus obtained into contact with the surface of the substrate preheated to a temperature above 300° C., preferably from 300° C. to 600° C. under a pressure of from $7.5 \times 10^{-6}$ to $1.5 \times 10^{-2}$ Torr., preferably under a pressure ranging from $5 \times 10^{-3}$ to $1.2 \times 10^{-2}$ Torr.

The substrate which may be used in practicing the present invention is any inorganic solid which is stable at or above the film deposition temperature, and examples thereof include: glass, quartz, silicon, gallium arsenide, sapphire, alkali metal niobate, alkaline earth metal titanate, gallium nitride, niobium nitride and the like. Among those, single crystals of silicon, gallium arsenide and sapphire are preferred when the coated substrate is intended for use in electronic applications.

The following Preparation Examples and Examples are provided only for the purpose of illustrating certain aspects of the present invention; and they are not to be construed as limiting the scope of the present invention in any way.

In each of Examples, the coated substrate obtained after treatment with an organometallic compound was immediately transferred to an X-ray photoelectron spectroscope in order to minimize its exposure to air.

PREPARATION EXAMPLE 1
Synthesis of Lithium Dimethylaluminum Isopropoxide ($LiOPr^i.(Pr^iO)AlMe_2$)

3.55 g (53.8 mmol) of lithium isopropoxide was added to 6.25 g (53.8 mmol) of dimethylaluminum isopropoxide dissolved in diethyl ether and stirred for a day. The resulting mixture was distilled under a reduced pressure to remove the solvent and the resulting solid residue was sublimed under a vacuum at 110° C. to obtain 8.98 g (49.3 mmol; 92% yield) of the title compound in the form of a white solid.

$^1$H NMR (300 MHz, benzene-$d_6$) δ –0.04 (singlet, Al(CH$_3$)$_2$, 6H), 1.60 (doublet, OCH(CH$_3$)$_2$, 24H), 4.20 (septet, OCH(CH$_3$)$_2$, 2H).

m.p.: 78° C.

vapor pressure: $7.8 \times 10^{-2}$ Torr at 30° C.

PREPARATION EXAMPLE 2
Synthesis of Lithium Dimethylaluminum Tert-butoxide ($LiOBu^t.(Bu^tO)AlMe_2$)

6.46 g (26.2 mmol) of aluminum tert-butoxide was added to 3.78 g (52.4 mmol) of trimethylaluminum dissolved in diethyl ether and stirred for a day to obtain dimethylaluminum tert-butoxide. 6.30 g (78.6 mmol) of lithium tert-butoxide was added thereto and stirred for a day. The resulting mixture was distilled under a reduced pressure to remove the solvent and the resulting solid residue was sublimed under a vacuum at 180° C. to obtain 10.59 g (50.4 mmol; 64% yield) of the title compound in the form of a white solid.

$^1$H NMR (300 MHz, benzene-$d_6$) δ 1.10 (singlet, Al(CH3)2, 6H), 1.15 (singlet, OC(CH3)3, 9H)

PREPARATION EXAMPLE 3
Synthesis of Lithium Dimethylgallium Isopropoxide (LiOPr$^i$.(Pr$^i$O)GaMe$_2$)

1.32 g (20.0 mmol) of lithium isopropoxide was added to 3.18 g (20.0 mmol) of dimethylgallium isopropoxide dissolved in diethyl ether and stirred for a day. The solvent was removed under a reduced pressure to obtain 3.82 g (17.0 mmol; 85% yield) of the title compound in the form of a white solid.

$^1$H NMR (300 MHz, benzene-$d_6$) δ −0.47 (singlet, Ga(CH$_3$)$_2$, 6H), 1.17 (doublet, OCH(CH$_3$)$_2$, 12H), 4.03 (septet, OCH(CH$_3$)$_2$, 2H).

m.p.: 9° C.

vapor pressure: $9.5 \times 10^{-2}$ Torr at 29° C.

EXAMPLE 1
Deposition of a LiAlO$_2$ Heterometallic Oxide Film

The compound obtained in Preparation Example 1 was vaporized at 50° C. and the vapor thereof was conveyed to a Si(100) substrate preheated to 400° C. for 10 hours to deposit a film thereon. The X-ray photoelectron spectrum of the deposited film showed only the peaks corresponding to lithium, aluminum, oxygen and carbon. The elemental composition of the film surface determined by comparing the photoelectron peak areas corresponded to a Li:Al atomic ratio of 1.0:0.9.

EXAMPLE 2
Deposition of a LiAlO$_2$ Heterometallic Oxide Film

The compound obtained in Preparation Example 2 was vaporized at 65° C. and the vapor thereof was conveyed to a Si(111) substrate preheated to 400° C. for 8 hours to deposit a film thereon. The X-ray photoelectron spectrum of the deposited film showed only the peaks corresponding to lithium, aluminum, oxygen and carbon. The elemental composition of the film surface determined by comparing the photoelectron peak areas corresponded to a Li:Al atomic ratio of 1.0:1.1.

EXAMPLE 3
Deposition of a LiGaO$_2$ Heterometallic Oxide Film

The compound obtained in Preparation Example 3 was vaporized at 60° C. and the vapor thereof was conveyed to a Si(100) substrate preheated to 400° C. for 5 hours to deposit a film thereon. The X-ray photoelectron spectrum of the deposited film showed only the peaks corresponding to lithium, gallium, oxygen and carbon. The elemental composition of the film surface determined by comparing the photoelectron peak areas corresponded to a Li:Ga atomic ratio of 1.0:0.9.

As shown above, the organometallic compound having the formula of LiOR'.(R'O)MR$_2$ of the present invention can be vaporized at a temperature ranging from room temperature to 100° C., and therefore, it may be advantageously employed in the CVD of an LiMO$_2$ type heterometallic oxide film. In addition, the organometallic compound of the present invention may be used in the production of an LiMO$_2$ type heterometallic oxide powder and in the chemical vapor infiltration (CVI) of porous materials with a LiMO$_2$ type oxide.

While the invention has been described with respect to the specific embodiments, it should be recognized that various modifications and changes may be made by those skilled in the art to the invention which also fall within the scope of the invention as defined by the appended claims.

What is claimed is:

1. A process for preparing a heterometallic oxide film of the LiMO$_2$ type on a substrate, which comprises contacting the vapor of a volatile organometallic compound of formula LiOR'.(R'O)MR$_2$ with a substrate heated to a temperature above 300° C., wherein M is a Group 13 element; R is a $C_{1-10}$ alkyl group; and R' is a $C_{2-10}$ alkyl group.

2. The process of claim 1, wherein said Group 13 element is Al or Ga.

3. The process of claim 1, wherein the organometallic compound is vaporized at a temperature ranging from room temperature to 100° C.

4. The process of claim 1, wherein the substrate is a single crystal of silicon, glass, gallium arsenide or sapphire.

* * * * *